(12) United States Patent
Kim et al.

(10) Patent No.: US 12,419,187 B2
(45) Date of Patent: Sep. 16, 2025

(54) APPARATUS AND METHOD FOR MANUFACTURING DISPLAY DEVICE USING EJECTION HEAD EJECTING ADHESIVE MATERIAL

(71) Applicant: Samsung Display Co., LTD., Yongin-si (KR)

(72) Inventors: Jong Hyup Kim, Incheon (KR); Yong Hwan Kim, Hwaseong-si (KR); Min Ho Bae, Cheonan-si (KR); Sang Hyuk Lee, Anyang-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 33 days.

(21) Appl. No.: 17/687,887

(22) Filed: Mar. 7, 2022

(65) Prior Publication Data

US 2022/0396064 A1 Dec. 15, 2022

(30) Foreign Application Priority Data

Jun. 14, 2021 (KR) .................. 10-2021-0076752

(51) Int. Cl.
*B05C 5/02* (2006.01)
*B05C 5/00* (2006.01)
(Continued)

(52) U.S. Cl.
CPC ............ *H10K 71/50* (2023.02); *B05C 5/001* (2013.01); *B05C 5/02* (2013.01); *B05C 5/0212* (2013.01); *B05C 5/0254* (2013.01); *B05C 9/12* (2013.01); *B05D 3/067* (2013.01); *B32B 7/12* (2013.01); *B32B 37/1284* (2013.01);
(Continued)

(58) Field of Classification Search
None
See application file for complete search history.

(56) References Cited

U.S. PATENT DOCUMENTS 3,570,056 A * 3/1971 Hall ...................... B29C 48/397
425/168
5,368,645 A * 11/1994 Bok .................... H01L 21/6715
269/21
(Continued)

FOREIGN PATENT DOCUMENTS

JP H09-276769 * 10/1997
KR 1020000032387 A 6/2000
(Continued)

*Primary Examiner* — Binu Thomas
(74) *Attorney, Agent, or Firm* — CANTOR COLBURN LLP

(57) ABSTRACT

An apparatus and method for manufacturing a display device are provided. The apparatus for manufacturing the display device, includes: a stage, and an ejection head including an ejection outlet, which is open upward in a first direction opposite to a direction of gravity. The ejection head is configured to move in a second direction, which intersects the first direction, and disposed under the stage in the direction of the gravity. The ejection head includes a body part, which contains an adhesive material, and a stirring part, which is disposed in the body part and includes a roller, which rotates a predetermined number of times per unit time to control viscosity of the adhesive material.

15 Claims, 16 Drawing Sheets

(51) Int. Cl.
    *B05C 9/12*     (2006.01)
    *B05D 3/06*     (2006.01)
    *B32B 7/12*     (2006.01)
    *B32B 37/12*     (2006.01)
    *H10H 20/85*     (2025.01)
    *H10K 50/84*     (2023.01)
    *H10K 71/00*     (2023.01)
    *H10K 71/50*     (2023.01)
    *H10K 59/80*     (2023.01)
    *H10K 71/40*     (2023.01)

(52) U.S. Cl.
    CPC ....... *H10H 20/8506* (2025.01); *H10K 50/841* (2023.02); *H10K 71/00* (2023.02); *B32B 2037/1253* (2013.01); *B32B 2457/20* (2013.01); *H10K 59/871* (2023.02); *H10K 71/40* (2023.02)

(56) References Cited

U.S. PATENT DOCUMENTS

| | | | |
|---|---|---|---|
| 11,167,539 B2 | 11/2021 | Jang et al. | |
| 2006/0284920 A1* | 12/2006 | Iwata | B41J 2/145 |
| | | | 347/19 |
| 2016/0114340 A1* | 4/2016 | Choi | B05C 9/14 |
| | | | 239/128 |
| 2019/0224954 A1* | 7/2019 | Jang | B05C 5/027 |

FOREIGN PATENT DOCUMENTS

| | | |
|---|---|---|
| KR | 1020160047388 A | 5/2016 |
| KR | 1020190090108 A | 8/2019 |
| KR | 102176438 B1 | 11/2020 |

\* cited by examiner

APPARATUS AND METHOD FOR MANUFACTURING DISPLAY DEVICE USING EJECTION HEAD EJECTING ADHESIVE MATERIAL

This application claims priority to Korean Patent Application No. 10-2021-0076752, filed on Jun. 14, 2021, and all the benefits accruing therefrom under 35 U.S.C. § 119, the content of which in its entirety is herein incorporated by reference.

BACKGROUND

1. Field

The present disclosure relates to an apparatus and method for manufacturing a display device.

2. Description of the Related Art

A display device is becoming more important with developments in multimedia technology. Accordingly, various display devices such as an organic light-emitting diode ("OLED") display device, a liquid crystal display ("LCD") device, and the like have been used. The application of such display devices has been diversified, ranging from various electronic devices such as televisions ("TVs"), smartphones, smartwatches, or tablet personal computers ("PCs").

Typically, the display device may include a cover window to protect a display panel. The cover window may be attached to the display panel via an optically clear adhesive ("OCA"). The OCA may be applied onto the display panel with the use of inkjet equipment or a roller.

SUMMARY

Embodiments of the present disclosure provide an apparatus and method for manufacturing a display device, which can respond to various planar shapes of display panels and can apply an adhesive member to a uniform thickness.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the disclosure, an apparatus for manufacturing a display device, includes a stage; and an ejection head including an ejection outlet, which is open upward in a first direction. The ejection head is disposed under the stage and configured to move in a second direction, which intersects the first direction. "upward in the first direction" is opposite to a direction of gravity.

In an embodiment, the ejection outlet may be disposed to face the stage and extend in a third direction, which intersects the first and second directions.

In an embodiment, the ejection head may include a body part, which contains an adhesive material, and a stirring part, which is disposed in the body part and includes a roller.

In an embodiment, the ejection head may further include an ejection driving part, which is connected to the body part and ejects the adhesive material to outside through the ejection outlet.

In an embodiment, the ejection head may further include a heat unit disposed in the body part to surround the stirring part.

In an embodiment, the apparatus may further include: a light irradiation unit disposed under the stage and which applies light toward a bottom surface of the stage, and the light irradiation unit may be configured to move in the second direction.

In an embodiment, during an ejection process using the ejection head, the ejection head and the light irradiation unit may move in the second direction, and the light irradiation unit may be disposed in a direction opposite to the second direction from the ejection head.

In an embodiment, during the ejection process using the ejection head, a distance between the ejection head and the light irradiation unit in the second direction may be constantly maintained.

In an embodiment, the ejection head and the light irradiation unit may be integrated with each other.

According to an embodiment of the disclosure, an apparatus for manufacturing a display device, includes: a stage including a mounting surface, to which a display panel is fixed, where the stage is rotatable, and an ejection head which ejects an adhesive material onto the mounting surface in a case where the stage is rotated such that the mounting surface faces downward in a first direction, which corresponds to that the mounting surface faces in a direction of gravity.

In an embodiment, the stage may include a rotation unit, which changes an orientation direction of the mounting surface.

In an embodiment, the ejection head may be disposed to face the mounting surface when the mounting surface faces downward.

In an embodiment, the ejection head may include an ejection outlet, which is open upward in the first direction and ejects the adhesive material, and "upward in the first direction" may be opposite to a direction of gravity.

In an embodiment, the ejection outlet may extend in a second direction, which intersects the first direction, and the ejection head may eject the adhesive material while moving in a third direction, which intersects the first and second directions.

In an embodiment, the apparatus may further include: a light irradiation unit which applies light to the display panel while moving in the third direction, when the ejection head is ejecting the adhesive material. The light irradiation unit may be disposed in a direction opposite to the third direction from the ejection head, and the light irradiation unit may temporarily cure the adhesive material, disposed on the mounting surface.

In an embodiment, the display panel may define an opening therein, and the ejection head may be disposed under the display panel and eject the adhesive material while moving in a second direction, which intersects the first direction, but not eject the adhesive material while passing by the opening.

In an embodiment, the display panel may include an application surface which faces the ejection head when the ejection head is ejecting the adhesive material, and the application surface may be more hydrophilic than a side surface of the display panel that defines the opening.

According to an embodiment of the disclosure, a method of manufacturing a display device, includes: fixing a display panel on a stage; rotating the stage such that the display panel faces downward; applying an adhesive material on a bottom surface of the display panel; curing the adhesive material, applied on the display panel; and coupling a cover window onto the display panel.

In an embodiment, the applying of the adhesive material may be performed using an ejection head, and the ejection head may eject the adhesive material onto the bottom surface of the display panel while moving.

In an embodiment, the curing of the adhesive material may be performed using a light irradiation unit, and the light irradiation unit may apply light to the adhesive material applied on the display panel, while moving in the same direction as the ejection head.

According to the aforementioned and other embodiments of the present disclosure, an optically clear adhesive (OCA) can be applied to a uniform thickness on surfaces of display panels having various planar shapes.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Embodiments of the present disclosure will hereinafter be described with reference to the accompanying drawings.

Figure 1:
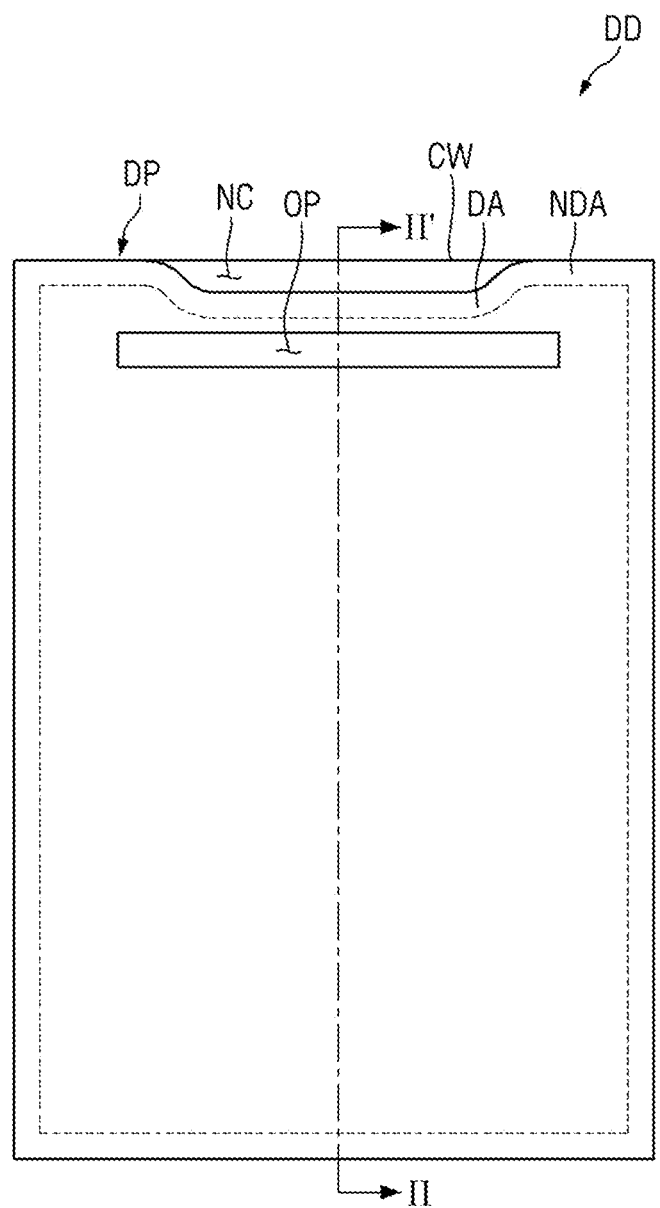
FIG. 1 is a plan view of a display device according to an embodiment of the present disclosure.
Figure 2:
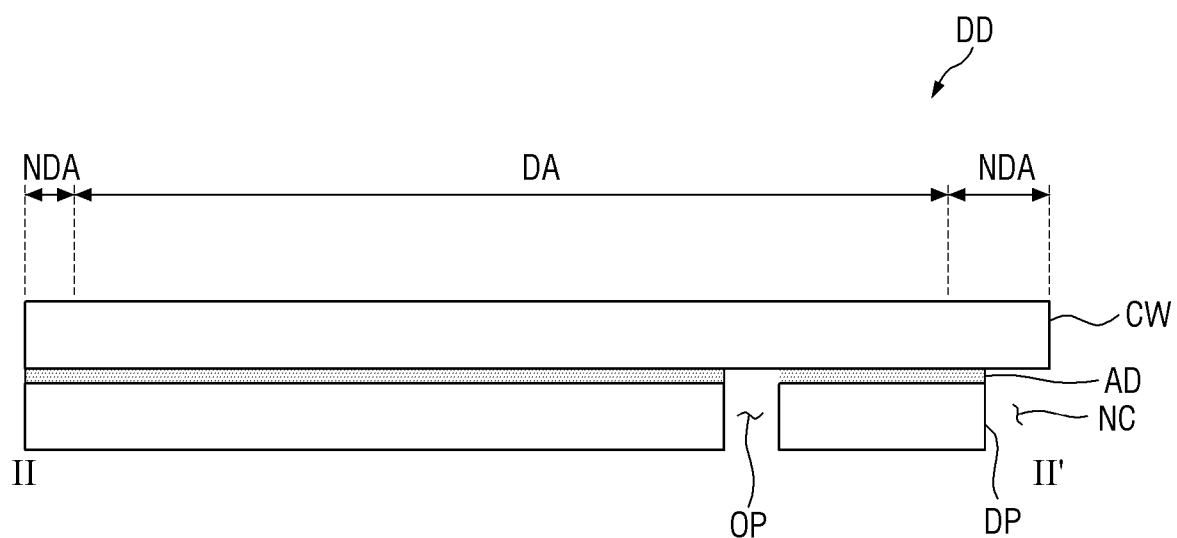
FIG. 2 is a cross-sectional view taken along line II-II' of FIG. 1.

FIG. 1 is a plan view of a display device according to an embodiment of the present disclosure. FIG. 2 is a cross-sectional view taken along line II-II' of FIG. 1.

Referring to FIGS. 1 and 2, a display device DD may include a display area DA and a non-display area NDA. The display area DA may be an area in which an image is displayed, and the non-display area NDA may be an area in which no image is displayed. The display area DA may be positioned in the middle of the display device DD, and the non-display area NDA may be positioned on the periphery of the display area DA. For example, the non-display area NDA may surround the display area DA.

The display device DD may include a display panel DP and a cover window CW, which is disposed on the display panel DP.

The display panel DP may include elements and circuits for displaying an image, such as, for example, pixel circuits (e.g., switching elements) and self-light-emitting elements that emit light in accordance with the operation of the pixel circuits. In some embodiments, the self-light-emitting elements may include organic light-emitting diodes (OLEDs), quantum-dot light-emitting diodes ("QLEDs"), inorganic material-based micro-light-emitting diodes (microLEDs), and/or inorganic material-based nano light-emitting diodes (nano LEDs) having a nano-scale width and/or length. The display panel DP may have a first surface facing the cover window CW and a second surface opposite to the first surface.

The display panel DP may include an opening OP, which penetrates the display panel DP in a thickness direction, and a notch NC. The opening OP may be disposed in the display area DA, but the present disclosure is not limited thereto. Alternatively, the opening OP may be disposed in the non-display area NDA. The notch NC may be recessed downwardly from the top edge of the display panel DP in a plan view.

The cover window CW may be disposed at the front of the display panel DP, may protect the display panel DP, and may transmit light emitted from the display panel DP therethrough. The cover window CW may include a rigid material such as glass, plastic, or quartz.

The cover window CW may be disposed to overlap with the display panel DP and cover the front of the display panel DP. The cover window CW may have a similar planar shape to the display panel DP and have a larger size than the display panel DP. For example, both short sides of the cover window CW may protrude outwardly beyond the display panel DP. The cover window CW may be disposed to overlap with the opening OP and the notch NC of the display panel DP.

The display device DD may further include an adhesive member AD, which is disposed between the display panel DP and the cover window CW. The adhesive member AD may couple the display panel DP and the cover window CW. The adhesive member AD may be an optically clear adhesive (OCA) or an optically clear resin ("OCR").

The adhesive member AD may not be disposed in a region where the opening OP of the display panel DP is disposed. The adhesive member AD may be disposed in the entire display panel DP except for the opening OP. The adhesive member may be disposed in a region where the display panel DP and the cover window CW are in contact with each other.

The adhesive member AD may be formed on the first surface of the display panel DP by an apparatus 1 for manufacturing a display device according to an embodiment of the present disclosure, and the apparatus 1 will hereinafter be described with reference to FIGS. 3 and 4.

Figure 3:
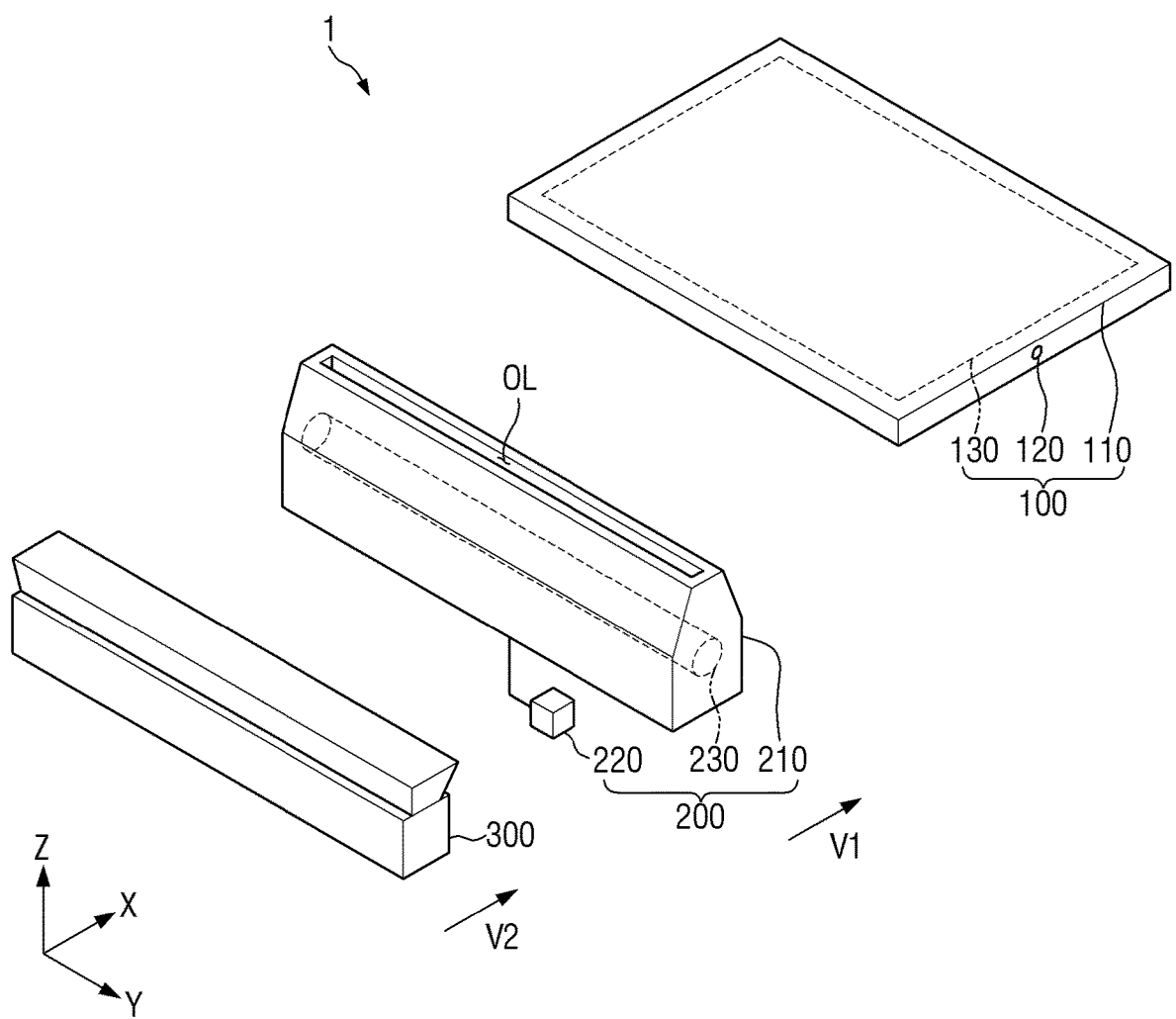
FIG. 3 is a perspective view of an apparatus for manufacturing a display device according to an embodiment of the present disclosure.

FIG. 3 is a perspective view of an apparatus for manufacturing a display device according to an embodiment of the present disclosure. FIG. 4 is a cross-sectional view of the apparatus of FIG. 3.

Figure 4:
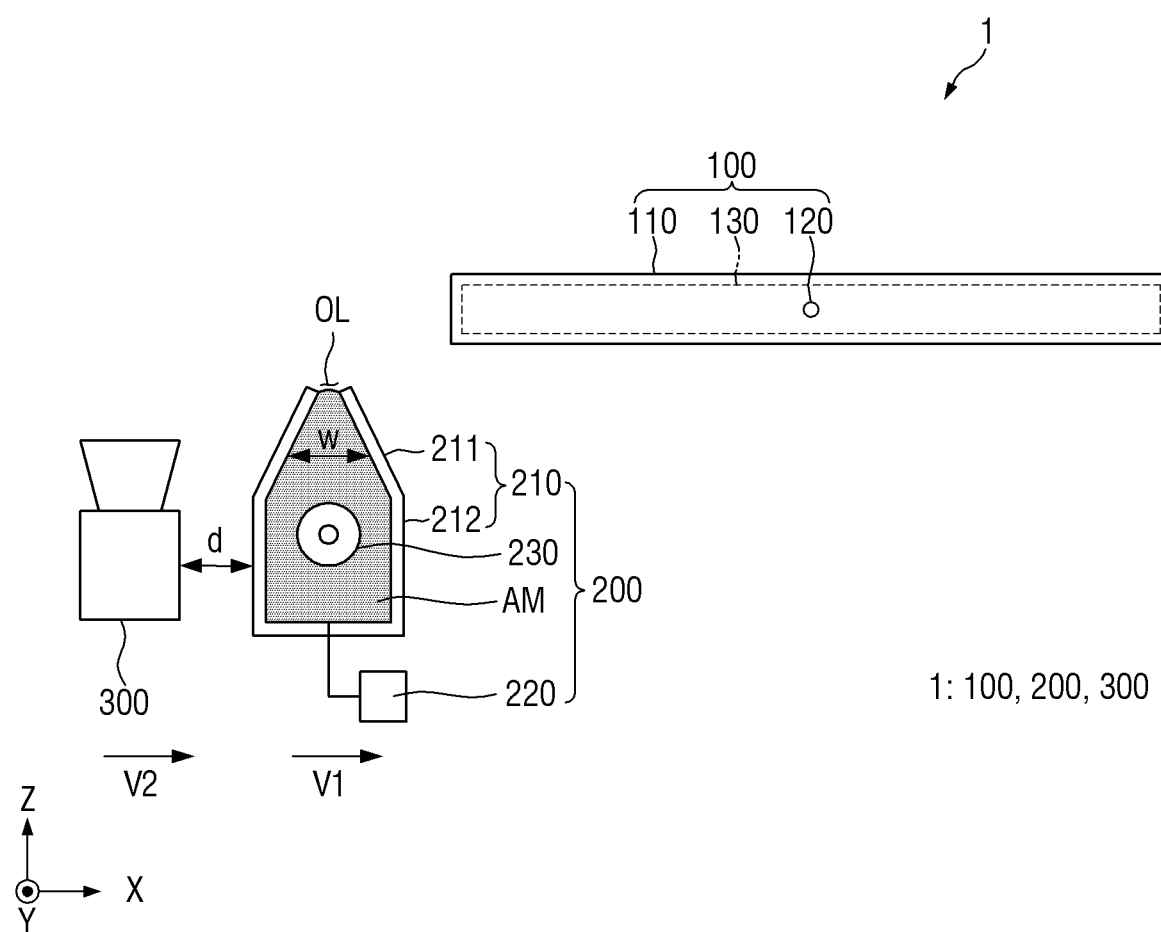
FIG. 4 is a cross-sectional view of an apparatus of FIG. 3.

Referring to FIGS. 3 and 4, the apparatus 1 may include a stage 100, an ejection head 200, and a light irradiation unit 300.

The stage 100 may include a mounting unit 110, a rotation unit 120, which rotates the mounting unit 110, and a fixing unit 130, which is disposed in the mounting unit 110.

The mounting unit 110 may provide space in which a target substrate is mounted. Here, the target substrate may be the display panel DP of FIGS. 1 and 2. In the description that follows, the target substrate will be described as being the display panel DP. The mounting unit 110 may have a flat plate shape. The planar shape of the mounting unit 110 may be similar to the planar shape of the target substrate. For example, the mounting unit 110 may have a rectangular shape in a plan view, but the present disclosure is not limited thereto.

The rotation unit 120 may rotate the mounting unit 110. The rotation unit 120 may change the orientation directions (i.e., normal direction of the surface) of the surfaces of the mounting unit 110 by rotating the mounting unit 110. For example, the rotation unit 120 may rotate the mounting unit 110 such that a first surface of the mounting unit 110 that is disposed on a third direction Z, of the mounting unit 110 may face an opposite direction of the third direction Z, of the mounting unit 110 and a second surface of the mounting unit 110 that is disposed on the opposite direction of the third direction Z of the mounting unit 110 may face the third direction Z of the mounting unit 110. Here, the second surface of the mounting unit 110 is opposite to the first surface of the mounting unit 110.

The rotation unit 120 may include a rotation axis that extends in one direction. FIG. 3 illustrates the rotation unit 120 as including a rotation axis extending in a second direction Y, but the present disclosure is not limited thereto. That is, the direction in which the rotation axis of the rotation unit 120 extends may be any direction parallel to the plane defined by a first direction X and the second direction Y.

Although not specifically illustrated, the rotation unit 120 may further include a rotation driver, which rotates the mounting unit 110 with respect to the rotation axis. For example, the rotation driver may include a motor.

However, the rotation unit 120 is merely exemplary. That is, the orientation directions of the first and second surfaces of the mounting unit 110 may be changed by an element other than the rotation unit 120.

The fixing unit 130 may be disposed in the mounting unit 110. The fixing unit 130 may fix the target substrate on the mounting unit 110. The fixing unit 130 may include an electrostatic chuck. Specifically, power may be applied to the fixing unit 130. The fixing unit 130 may generate an electrostatic force with the power applied thereto and may fix the target substrate to the mounting unit 110 with the electrostatic force. Alternatively, the fixing unit 130 may include a vacuum suction chuck and may fix the target substrate to the mounting unit 110 with the vacuum suction chuck. In this case, although not specifically illustrated, the fixing unit 130 may include a plurality of suction holes.

The ejection head 200 may eject an adhesive material AM. The ejection head 200 may apply the adhesive material AM onto a second surface, facing downward, of the target substrate, which is fixed on a second side, facing downward, of the stage 100. The ejection head 200 may apply the adhesive material AM while moving in the first direction X. The ejection head 200 may include a body part 210, an ejection driving part 220, and a stirring part 230. A moving speed V1 of the ejection head 200 may be constant, but the present disclosure is not limited thereto. Alternatively, the moving speed V1 of the ejection head 200 may change in the process of applying the adhesive material AM.

The body part 210 may include an inner space to accommodate the adhesive material AM. The body part 210 may extend in the second direction Y. The body part 210 may include a receiving part 212 and an ejection part 211.

The receiving part 212 may accommodate the adhesive material AM. Specifically, the adhesive material AM may be accommodated in the inner space of the receiving part 212. The ejection part 211 may be disposed on an upper part, in the third direction Z, of the receiving part 212. The receiving part 212 and the ejection part 211 may be spatially connected to each other. The ejection part 211 may include an ejection outlet OL, which is open upward in the third direction Z. The ejection outlet OL may extend in the second direction Y. The ejection outlet OL may be disposed to face a second surface, facing downward, of the stage 100. An inner width W of the ejection part 211 in the first direction X may gradually decrease in the third direction Z.

The ejection driving part 220 may be connected to the body part 210. The ejection driving part 220 may deliver a driving force for ejecting the adhesive material AM from the inside of the body part 210 to the outside of the body part 210. For example, the ejection driving part 220 may include a syringe or a pump.

The ejection driving part 220 may provide an ejection driving force that pushes the adhesive material AM out of the ejection part 211. That is, the adhesive material AM may be ejected by the ejection driving force from the ejection driving part 220.

The ejection driving part 220 may assist with the ejection of the adhesive material AM by the ejection part 211. The adhesive material AM in the ejection part 211 may move toward the target substrate due to an attractive force toward the target substrate. As the adhesive material AM in the ejection part 211 moves toward the target substrate, the ejection driving part 220 may move the adhesive material AM in the receiving part 212 toward the ejection part 211.

The stirring part 230 may be disposed in the body part 210. The stirring part 230 may include a roller, which extends in the second direction Y. The stirring part 230 may control the viscosity of the adhesive material AM with the rotation of the roller. For example, the roller of the stirring part 230 may rotate a predetermined number of times per unit time and may thus be able to maintain the viscosity of the adhesive material AM. To maintain the viscosity of the adhesive material AM to a certain value, the number of rotations per unit time of the roller may be raised as the viscosity of the adhesive material AM increases, and the number of rotations per unit time of the roller may be reduced as the viscosity of the adhesive material AM decreases.

The ejection head 200 may be disposed on the second side, in the third direction Z, of the stage 100. The ejection head 200 may eject the adhesive material AM while moving in the first direction X. The ejection head 200 may be disposed under the stage 100, and as the ejection outlet OL of the ejection head 200 is open upward, the adhesive material AM, ejected from the ejection head 200, may be applied onto the second surface (i.e., surface facing downward) of the target substrate, fixed on a bottom surface of the stage 100.

The application of the adhesive material AM onto the target substrate with the use of the ejection head 200 may be performed upward. That is, the adhesive material AM may be ejected and applied onto the target substrate in the opposite direction of the direction of gravity. The direction of gravity may refer to the "second side in the third direction Z", and the opposite direction of the direction of gravity may refer to the "first side in the third direction Z". Thus, in a case where the target substrate defines an opening (see "OP" of FIG. 1) therein, the adhesive material AM may not be applied on a side surface of the target substrate that defines the opening OP. Also, in this case, the adhesive material AM may not be applied to portion of the first surface of the stage 100, exposed by the opening OP. Thus, the stage 100 can be effectively prevented from being contaminated with the adhesive material AM.

The ejection outlet OL may extend in the second direction Y. Thus, in a case where the ejection head 200 applies the adhesive material AM while moving in the first direction X, the adhesive material AM may be applied to a predetermined area of the target substrate, defined by the first and second directions X and Y. For example, if the ejection outlet OL has a first length in the second direction Y and the ejection head 200 ejects the adhesive material AM while moving in the first direction X by as much as a second length, the adhesive material AM may be applied to a rectangular area on the target substrate that has the second length in the first direction X and the first length in the second direction Y.

The thickness to which the adhesive material AM is applied onto the target substrate may be controlled with the moving speed V1 of the ejection head 200. For example, the faster the moving speed V1 of the ejection head 200 is, the thinner the adhesive material AM is applied onto the target substrate, and the slower the moving speed V1 of the ejection head 200 is, the thicker the adhesive material AM is applied onto the target substrate. That is, in a case where the viscosity of the adhesive material AM is uniform and the moving speed V1 of the ejection head 200 is constant, the thickness to which the adhesive material AM is applied onto the target substrate may also be uniform throughout the target substrate.

The light irradiation unit 300 may be disposed on a second side, in the first direction X, of the ejection head 200. The light irradiation unit 300 may temporarily cure the adhesive material AM by applying light to the adhesive material AM, applied onto the target substrate. The light irradiation unit 300 may be disposed in the opposite direction of the moving direction of the ejection head 200.

The light irradiation unit 300 may apply the light L upward. The light L may be ultraviolet light. The light L may temporarily cure the adhesive material AM, applied on the target substrate.

The light irradiation unit 300 may apply the light L while moving in the first direction X. The moving direction of the light irradiation unit 300 may be the same as the moving direction of the ejection head 200. Specifically, the light irradiation unit 300 may apply the light while moving in the first direction X, from the second side, in the first direction X, of the ejection head 200, when the ejection head 200 applies the adhesive material AM while moving in the first direction X. That is, to temporarily cure the adhesive material AM, applied by the ejection head 200, the light irradiation unit 300 may apply the light L while following the ejection head 200, from the second side, in the first direction X (or the moving direction), of the ejection head 200.

A moving speed V2 of the light irradiation unit 300 may be substantially the same as the moving speed V1 of the ejection head 200. In this case, a distance d between the ejection head 200 and the light irradiation unit 300 in the first direction X may be constantly maintained during the application of the adhesive material AM. However, the present disclosure is not limited to this. Alternatively, the moving speed V2 of the light irradiation unit 300 may be lower or higher than the moving speed V1 of the ejection head 200. The amount of light L applied by the light irradiation unit 300 may be raised as the moving speed V2 of the light irradiation unit 300 decreases, and the amount of light L applied by the light irradiation unit 300 may be reduced as the moving speed V2 of the light irradiation unit 300 increases.

The light irradiation unit 300 may extend in the second direction Y. The light L applied by the light irradiation unit 300 may be applied in the form of linear light extending in the second direction Y, but the present disclosure is not limited thereto. Alternatively, the light L applied by the light irradiation unit 300 may extend in the second direction Y, but may be in the form of surface light having a predetermined width in the first direction X.

During the application of the adhesive material AM and the application of the light L, the distance d between the light irradiation unit 300 and the ejection head 200 in the first direction X may be constantly maintained. Specifically, the interval between the application of the adhesive material AM, ejected from the ejection head 200, onto the target substrate and the application of the light L by the light irradiation unit 300 may become uniform.

The apparatus 1 can apply the adhesive material AM to a uniform thickness on the target substrate, using the ejection head 200, which includes the ejection outlet OL extending in the second direction Y and ejects the adhesive material AM while moving in the first direction X.

Also, the apparatus 1 includes the ejection head 200, which includes the ejection outlet OL that is open upward, and can thus apply the adhesive material AM onto the second surface, in the third direction Z, of the target substrate, fixed on the second side, in the third direction Z, of the stage 100. That is, the apparatus 1 can apply the adhesive material AM in the opposite direction of the direction of gravity. Thus, the adhesive material AM may not move toward the stage 100. That is, the stage 100 can be effectively prevented from being contaminated with the adhesive material AM. Also, in a case where the target substrate includes the opening OP, the side surface of the target substrate that defines the opening OP can be effectively prevented from being contaminated with the adhesive material AM.

Figure 5:
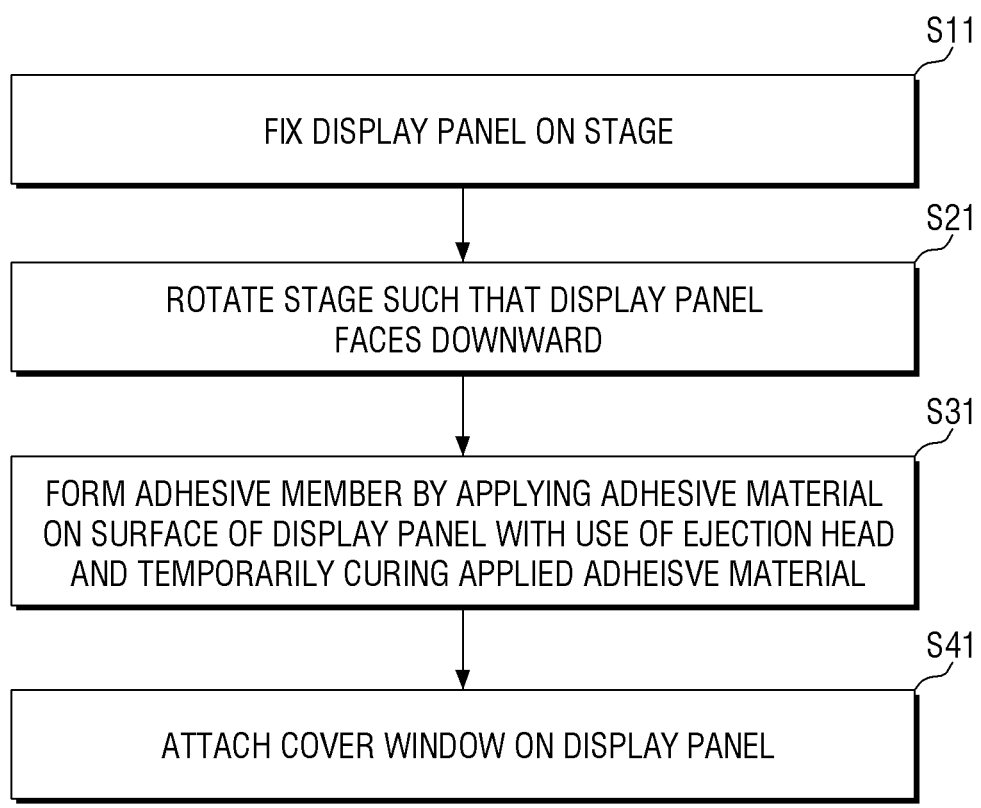
FIG. 5 is a flowchart illustrating a method of manufacturing a display device according to an embodiment of the present disclosure.

FIG. 5 is a flowchart illustrating a method of manufacturing a display device according to an embodiment of the present disclosure. FIGS. 6 through 14 are schematic views illustrating the method of FIG. 5.

A target substrate on a stage 100 will hereinafter be described as being, for example, a display panel DP, and for convenience, the display panel DP is illustrated in FIGS. 6 through 14 as defining an opening OP therein, but not including a notch NC.

Figure 6:
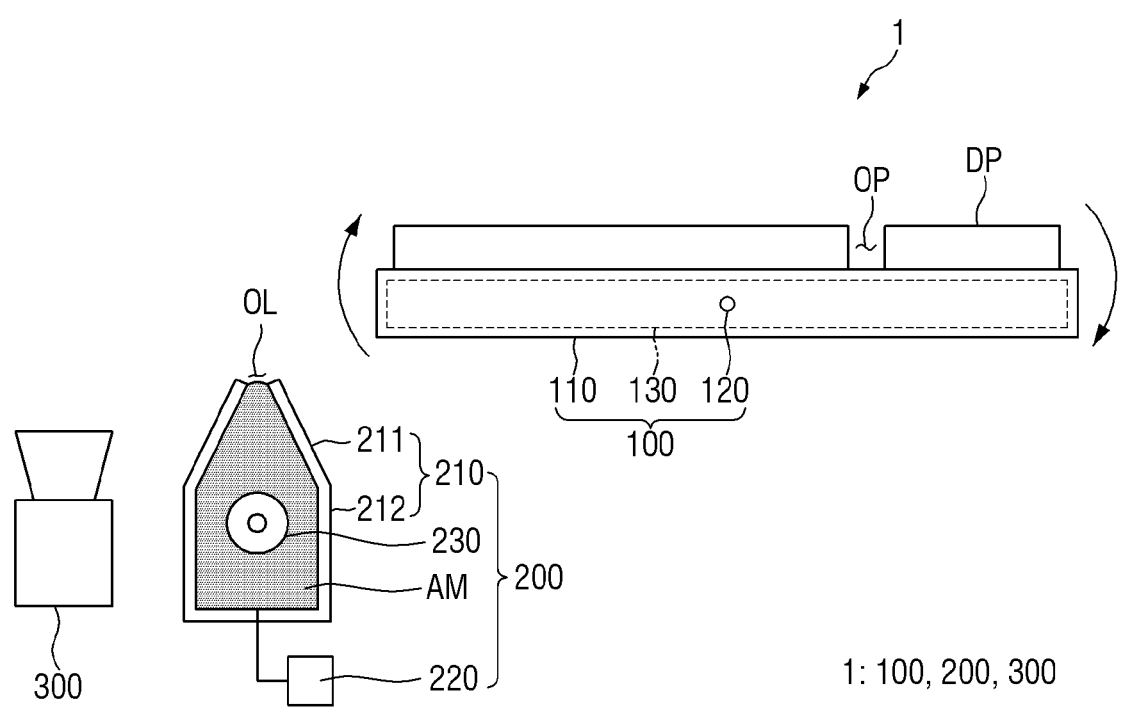
FIGS. 6 through 14 are schematic views illustrating the method of FIG. 5.
Figure 6:
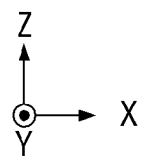

Referring to FIGS. 5 and 6, the method of manufacturing a display device may include fixing the display panel DP on the stage 100 (S11), rotating the stage 100 such that the display panel DP faces downward (S21), forming an adhesive member AD by applying an adhesive material AM on a first surface of the display panel DP with the use of an ejection head 200 and temporarily curing the adhesive material AM (S31), and attaching a cover window CW on the display panel DP (S41).

The display panel DP may be fixed on the stage 100 (S11). The display panel DP may define the opening OP therein. As already mentioned above with reference to FIGS. 3 and 4, the stage 100 may include a mounting unit 110, a rotation unit 120, and a fixing unit 130. The display panel DP may be disposed on the mounting unit 110 of the stage 100. Specifically, the display panel DP may be disposed on a first surface (i.e., a mounting surface) of the mounting unit 110.

Once the display panel DP is disposed on the first surface of the mounting unit 110, the fixing unit 130 is driven to fix the display panel DP on the mounting unit 110. Here, the expression "the fixing unit 130 is driven" means that power is supplied to the fixing unit 130 in a case where the fixing unit 130 is, for example, an electrostatic chuck, or negative pressure is provided to the fixing unit 130 in a case where the fixing unit 130 is, for example, a vacuum suction chuck.

Figure 7:
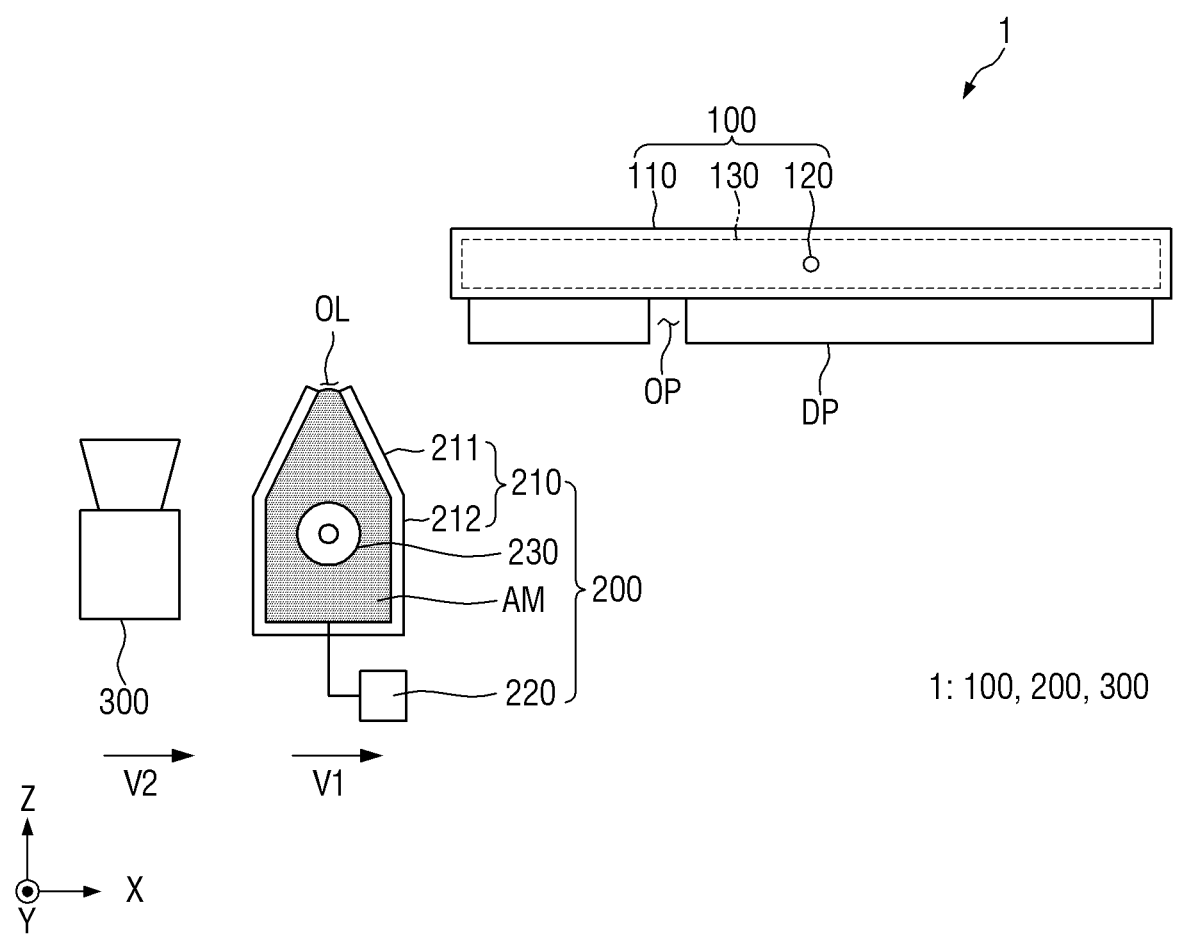

Thereafter, referring to FIGS. 5, 6, and 7, the stage 100 may be rotated such that the display panel DP may face downward (S21).

The stage 100 may be rotated by the rotation unit 120. The stage 100 may be rotated such that the first surface of the display panel DP faces downward. The rotation unit 120 may have a rotation axis extending in the second direction Y and may rotate the stage 100 about the rotation axis. As a result of the rotation of the stage 100, a facing direction of the first surface of the mounting unit 110 and a facing direction of a second surface of the mounting unit 110 may be interchanged. Here, the second surface of the mounting unit 110 is opposite to the first surface of the mounting unit 110. That is, the stage 100 may be rotated 180 degrees. Even though the stage 100 is rotated, the display panel DP may be fixed by the fixing unit 130.

In response to the stage 100 being rotated, the display panel DP, fixed by the mounting unit 110, may face downward (i.e., face a direction opposite to the direction of the gravity). If the display panel DP is not fixed by the fixing unit 130, the display panel DP may fall from the stage 100 due to gravity. However, as the display panel DP is fixed to the mounting unit 110 by the fixing unit 130, the display panel DP may not be detached from the stage 100.

Thereafter, referring to FIGS. 5 and 8 through 12, the adhesive member AD is formed (S31) by applying the adhesive material AM on the first surface of the display panel DP with the use of the ejection head 200 and temporarily curing the adhesive material AM.

Figure 8:
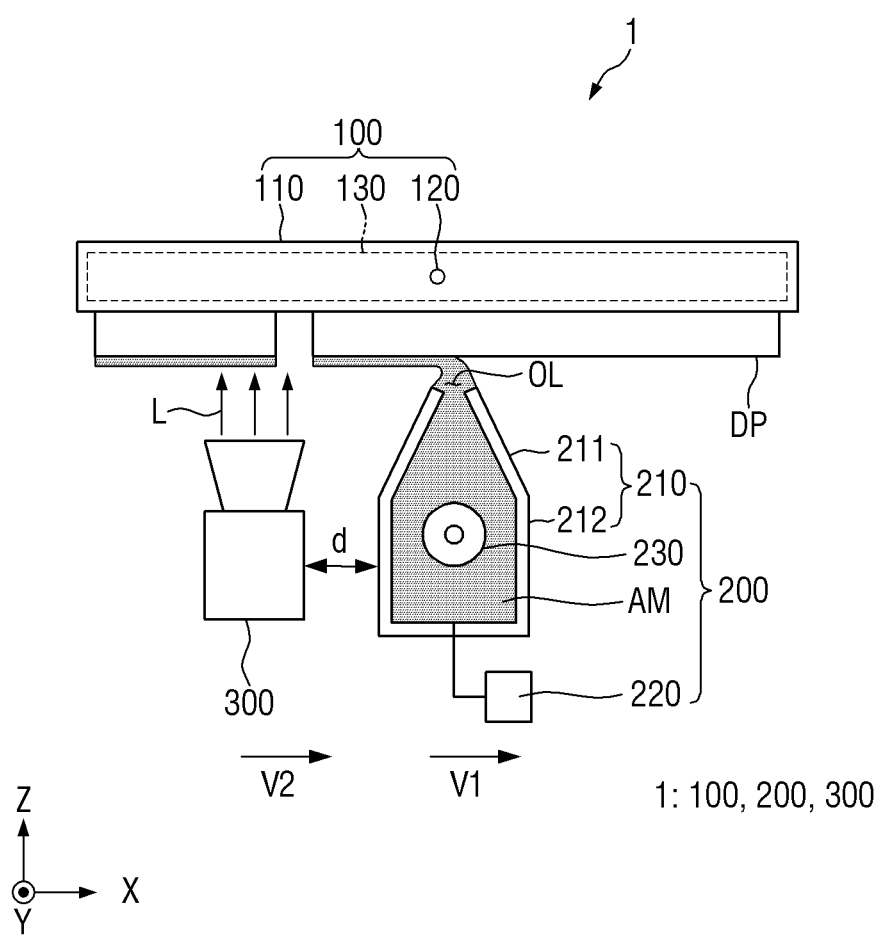
Figure 9:
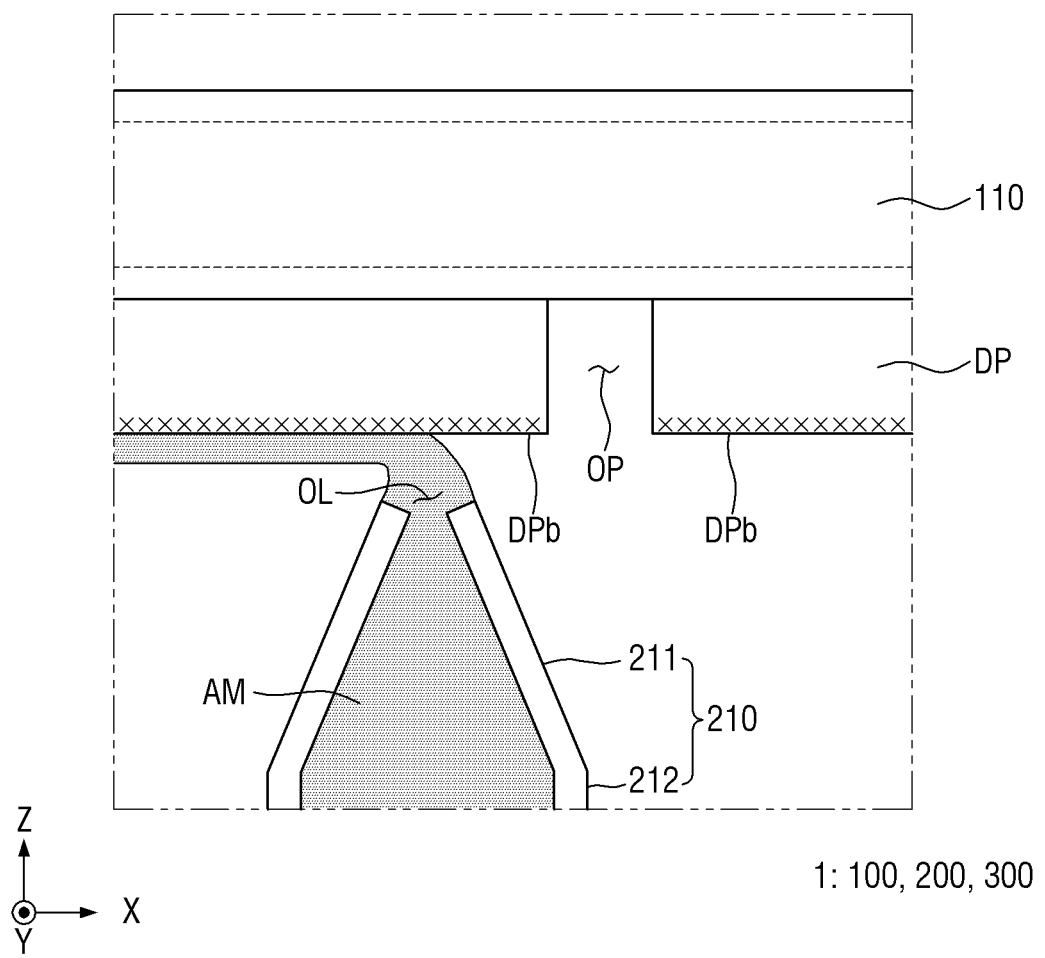
Figure 10:
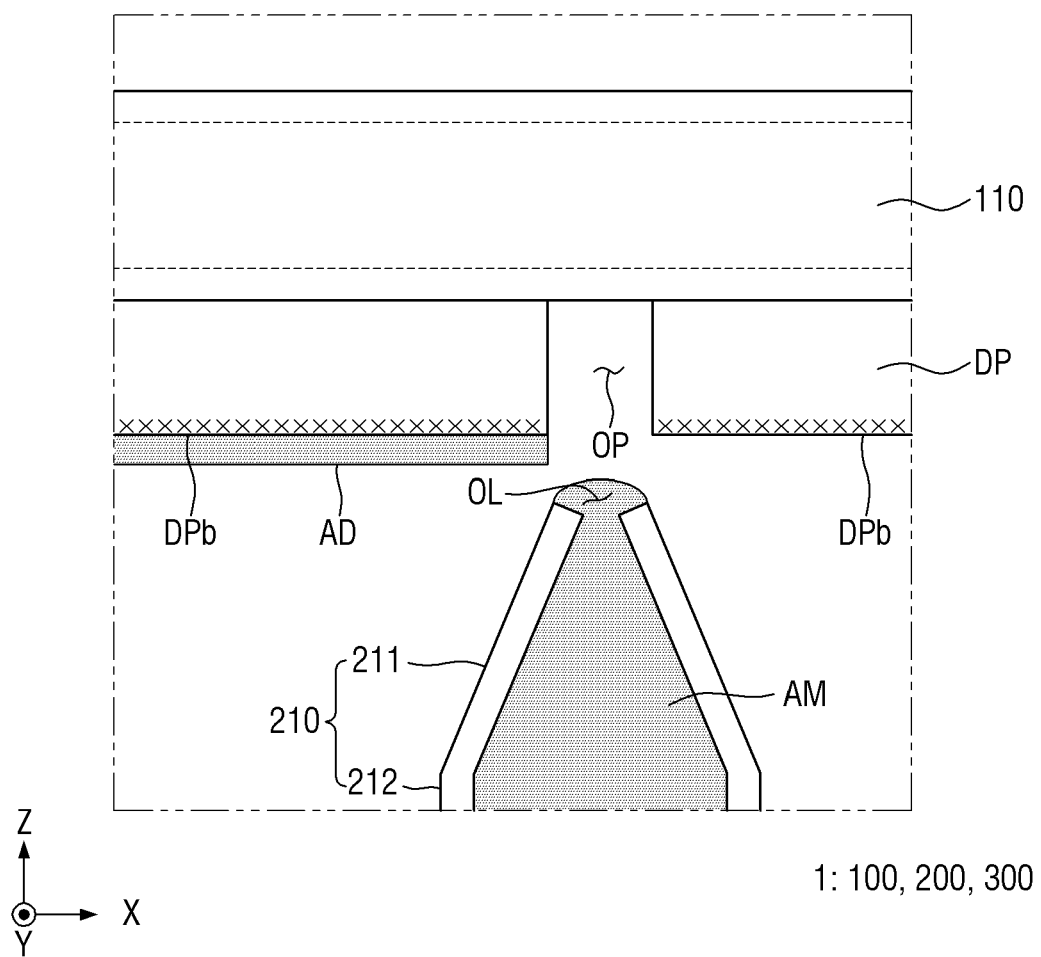
Figure 11:
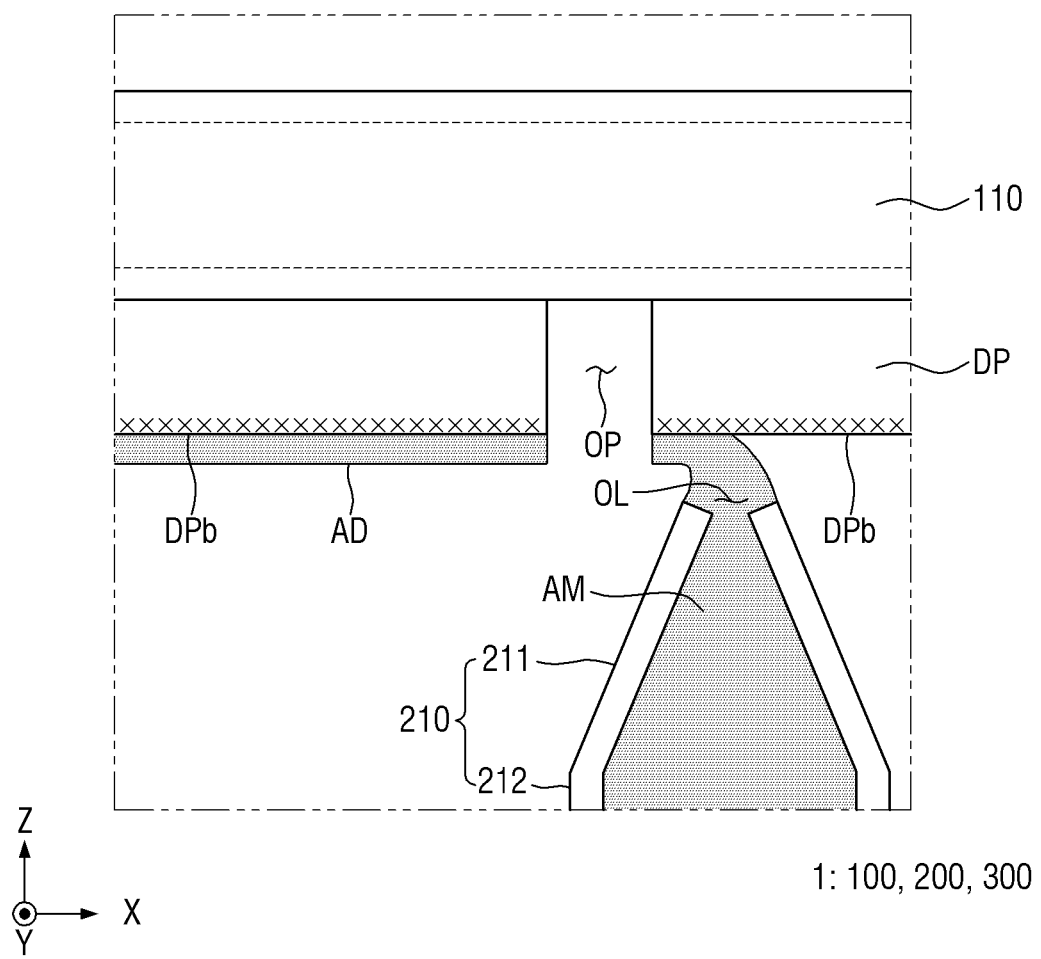
Figure 12:
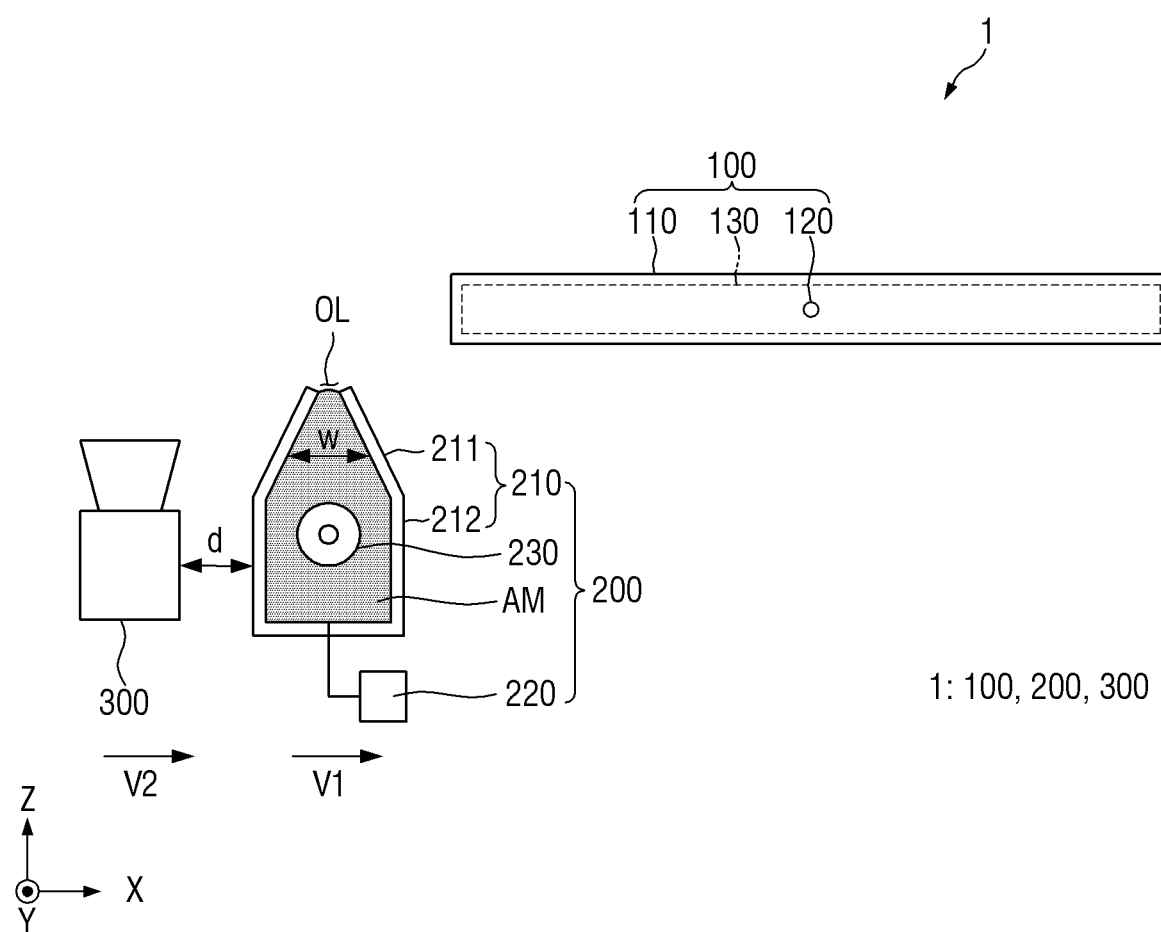

FIG. 8 illustrates how to apply and temporarily cure the adhesive material AM on an application surface DPb of the display panel DP with the use of the ejection head 200 and a light irradiation unit 300. FIGS. 9 through 11 illustrate how to form the adhesive member AD through the application of the adhesive material AM around the opening OP. FIG. 12 illustrates the adhesive member AD as being formed on the display panel DP.

The ejection head 200 may apply the adhesive material AM on the application surface DPb of the display panel DP while moving in the first direction X. The application surface DPb of the display panel DP may be disposed to face the second side in the third direction Z (i.e., downward). The adhesive material AM may be ejected from an ejection outlet OL of the ejection head 200 and may be applied on the application surface DPb of the display panel DP. The ejection head 200 may apply the adhesive material AM on the application surface DPb of the display panel DP while not being in contact with the display panel DP. A moving speed V1 of the ejection head 200 may be constant. Thus, the adhesive material AM may be applied with a uniform thickness on the application surface DPb of the display panel DP, and as a result, the thickness of the adhesive member AD may be uniform throughout the display panel DP.

The application surface DPb of the display panel DP may be hydrophilically treated with plasma. As a result, the application surface DPb of the display panel DP may be more hydrophilic than the side surfaces of the display panel DP. The adhesive material AM, which is applied onto the display panel DP, may be hydrophilic. An attractive force may act between the adhesive material AM and the display panel DP. Thus, the adhesive material AM can be stably applied onto the application surface DPb of the display panel DP.

The ejection outlet OL of the ejection head 200 may be placed near the application surface DPb of the display panel DP, and the adhesive material AM may be ejected from the ejection head 200 to move toward the application surface DPb of the display panel DP. Then, the adhesive material AM may be attached on the application surface DPb of the display panel DP.

Referring to FIG. 10, when the ejection head 200 is passing by a region where the opening OP is defined, the adhesive material AM may become relatively distant from the application surface DPb of the display panel DP and thus may not be ejected. That is, in a case where the ejection head 200 is placed to overlap with the opening OP in the third direction Z (i.e., in a plan view), the adhesive material AM may not be ejected from the ejection head 200. Also, the adhesive material AM can be effectively prevented from moving toward a side surface of the display panel DP that defines the opening OP. Thus, the adhesive material AM may not be applied on the side surface of the display panel DP that defines the opening OP.

Also, the adhesive material AM may not be applied on portion of the surface of the stage 100 that is exposed by the opening OP of the display panel DP. As the adhesive material AM is applied to the display panel DP turned upside down, the adhesive material AM can be effectively prevented from entering the opening OP due to gravity. As the application surface DPb of the display panel DP is hydrophilically treated but the side surface of the display panel DP that defines the opening OP is not hydrophilically treated, the adhesive material AM may not enter the opening OP. Also, when the ejection outlet OL overlaps the opening OP in a plan view, as the ejection outlet OL and the application surface DPb of the display panel DP become relatively distant from each other, the adhesive material AM may not be ejected. Thus, even if the application of the adhesive material AM is repeatedly performed, the side surface of the display panel DP that defines the opening OP and the portion of the surface of the stage 100 that is exposed by the opening OP of the display panel DP can be effectively prevented from being contaminated with the adhesive material AM.

As illustrated in FIG. 11, in a case where the ejection head 200 is placed back near the application surface DPb of the display panel DP (i.e., the ejection head 200 is placed back to overlap the application surface DPb) after passing by the region where the opening OP is disposed, the adhesive material AM may be ejected from the ejection outlet OL and may then be applied onto the application surface DPb of the display panel DP.

The ejection head 200 may apply the adhesive material AM while moving in the first direction X, and at the same time, the light irradiation unit 300 may apply light L toward the first side in the third direction Z (i.e., upward) while moving from a second side to a first side (e.g., from left to right) in the first direction X. A moving speed V2 of the light irradiation unit 300 may be substantially the same as the moving speed V1 of the ejection head 200, but the present disclosure is not limited thereto. Alternatively, the moving speed V2 of the light irradiation unit 300 may be lower or higher than the moving speed V1 of the ejection head 200. In a case where the moving speed V1 of the ejection head 200 and the moving speed V2 of the light irradiation unit 300 are the same, the distance between the ejection head 200 and the light irradiation unit 300 may be constant.

The light irradiation unit 300 may temporarily cure the adhesive material AM by applying the light L. In this manner, the adhesive member AD may be formed. Here, the expression "the adhesive material AM is temporarily cured" means that the adhesive material AM is not completely cured, but only half cured. The adhesive member AD, formed on the display panel DP, may have adhesiveness and may thus be coupled to the cover window CW later. The distance between the light irradiation unit 300 and the ejection head 200 in the first direction X may be constantly maintained.

As the adhesive material AM is applied on the application surface DPb of the display panel DP and is then temporarily cured by applying the light L, the adhesive member AD may be formed on the display panel DP.

Figure 13:
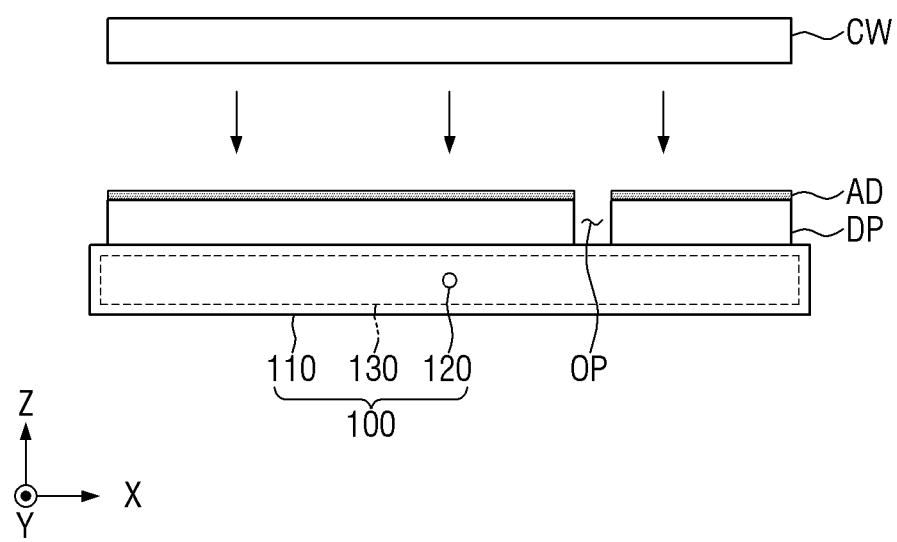
Figure 14:
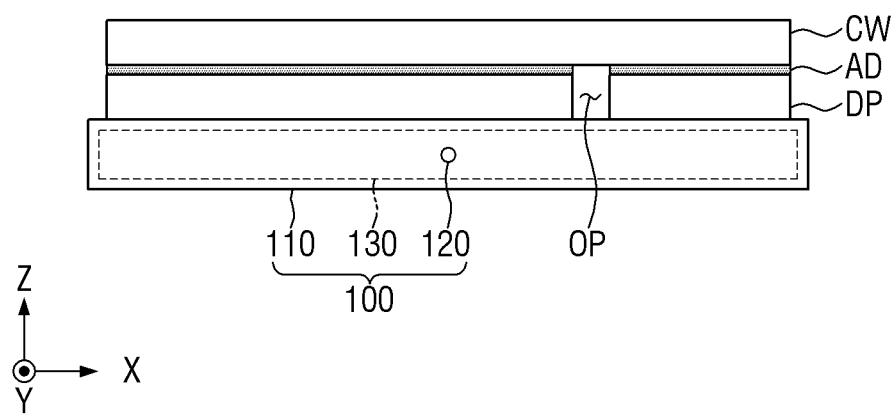

Thereafter, referring to FIGS. 5, 13, and 14, the cover window CW may be attached on the display panel DP (S41).

The attachment of the cover window CW may be performed after rotating the stage 100 again, but the present disclosure is not limited thereto. Alternatively, the attachment of the cover window CW may be performed with the display panel DP fixed on a second side, in the third direction Z, of the stage 100. It will hereinafter be described how to attach the cover window CW on the display panel DP after rotating the stage 100 again such that the display panel DP is placed back to be oriented so as to face upward.

Once the adhesive member AD is formed on the application surface DPb of the display panel DP, the stage 100 may be rotated again by the rotation unit 120.

The cover window CW may be coupled onto a first surface, in the third direction Z, of the display panel DP. The cover window CW may be coupled to the display panel DP by the adhesive member AD, which is disposed on the first surface, in the third direction Z, of the display panel DP. That is, the adhesive member AD may be disposed between the cover window CW and the display panel DP, but not in the region where the opening OP is disposed.

Apparatuses for manufacturing a display device according to other embodiments of the present disclosure will hereinafter be described, focusing mainly on the differences with the apparatus 1.

Figure 15:
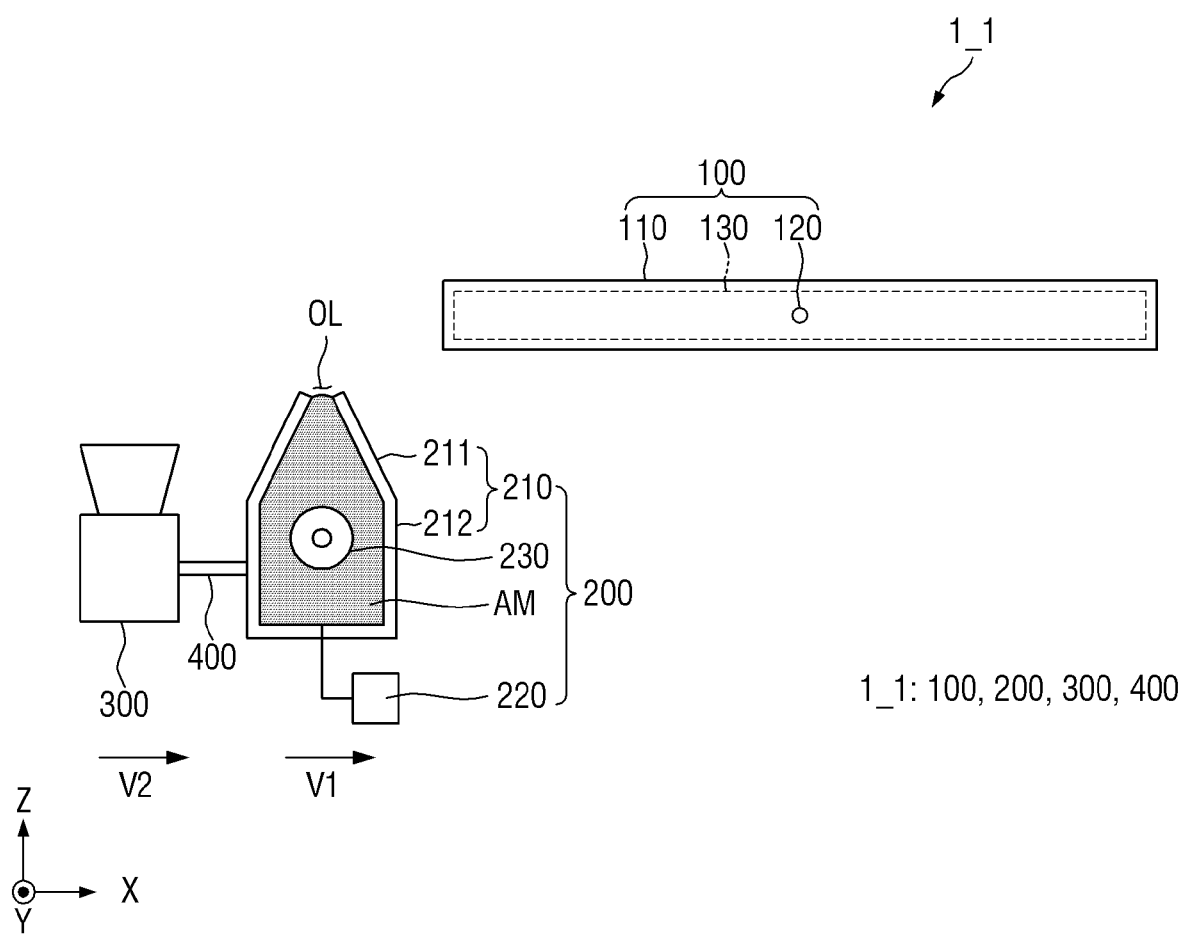
FIG. 15 is a cross-sectional view of an apparatus for manufacturing a display device according to another embodiment of the present disclosure.

FIG. 15 is a cross-sectional view of an apparatus for manufacturing a display device according to another embodiment of the present disclosure.

Referring to FIG. 15, an apparatus 1_1 for manufacturing a display device DD differs from the apparatus 1 in that an ejection head 200 and a light irradiation unit 300 are connected and thus integrated with each other.

The apparatus 1_1 may further include a coupling unit 400, which is disposed between the ejection head 200 and the light irradiation unit 300. The coupling unit 400 may integrate the ejection head 200 and the light irradiation unit 300 with each other. A first end, in the first direction X, of the coupling unit 400 may be coupled to the ejection head 200, and a second end, in the first direction X, of the coupling unit 400 may be coupled to the light irradiation unit 300. Thus, the ejection head 200 and the light irradiation unit 300 may move together. Also, the distance between the ejection head 200 and the light irradiation unit 300 in the first direction X may be constantly maintained. A distance d between the ejection head 200 and the light irradiation unit 300 may be substantially the same as the length of the coupling unit 400.

The apparatus 1_1 includes the ejection head 200, which includes an ejection outlet OL extending in the second direction Y, and may apply an adhesive material AM to a uniform thickness onto a target substrate with the use of the ejection head 200, which ejects the adhesive material AM while moving in the first direction X.

The apparatus 1_1 includes the ejection head 200, which includes an ejection outlet OL that is open upward, and may apply the adhesive material AM onto a second surface, in the third direction Z, of the target substrate, fixed on a second side, in the third direction Z, of a stage 100. That is, the apparatus 1_1 may apply the adhesive material AM in the opposite direction of the direction of gravity. Thus, the adhesive material AM may not move toward the stage 100. In other words, the stage 100 can be effectively prevented from being contaminated with the adhesive material AM. Also, in a case where the target substrate includes an opening OP, a side surface of the target substrate that defines the opening OP can be effectively prevented from being contaminated with the adhesive material AM.

Also, as the apparatus 1_1 further includes the coupling unit 400, which integrates the ejection head 200 and the light irradiation unit 300 with each other, the distance between the ejection head 200 and the light irradiation unit 300 in the first direction X can be constantly maintained. Thus, an adhesive member AD can be formed with a uniform degree of curing.

Figure 16:
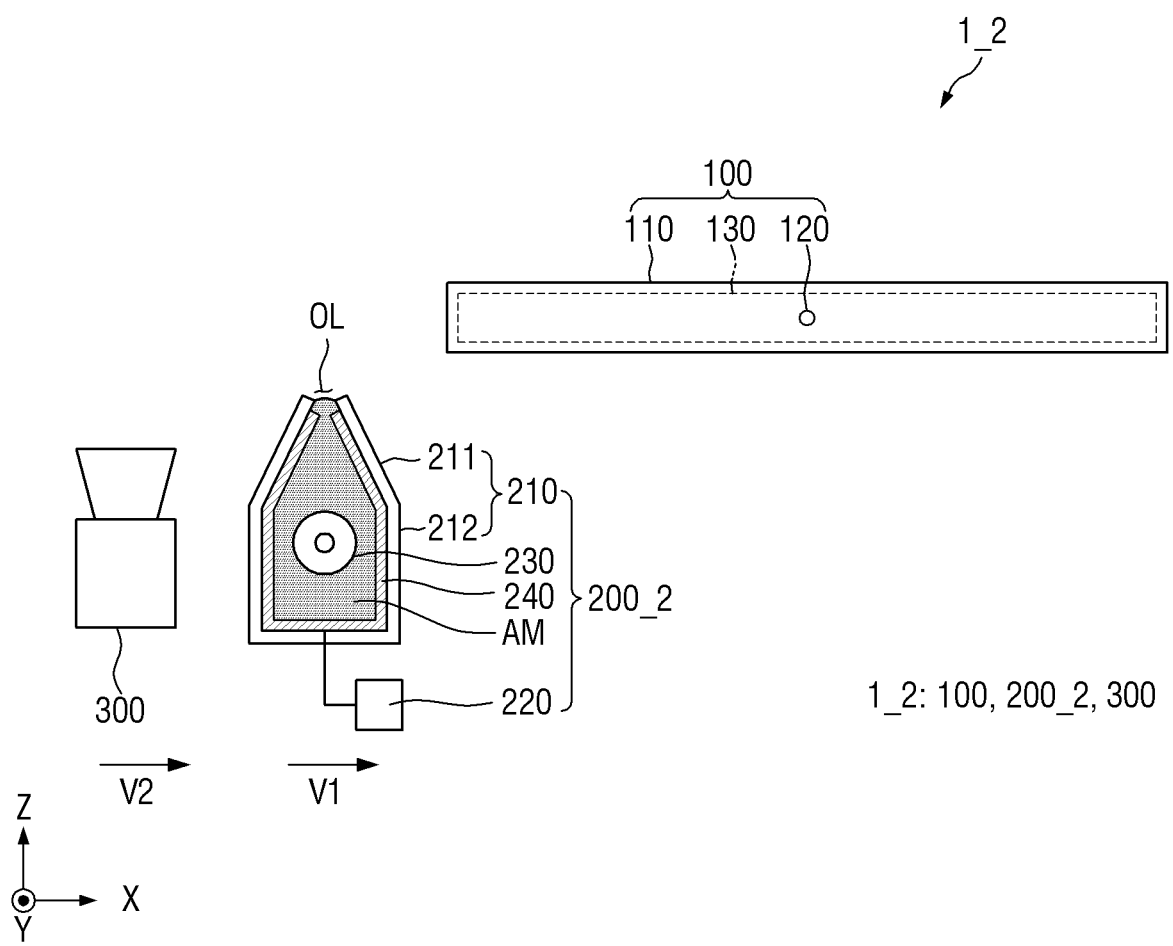
FIG. 16 is a cross-sectional view of an apparatus for manufacturing a display device according to still another embodiment of the present disclosure.

FIG. 16 is a cross-sectional view of an apparatus for manufacturing a display device according to still another embodiment of the present disclosure.

Referring to FIG. 16, an apparatus 1_2 for manufacturing a display device DD differs from the apparatus 1 in that an ejection head 200_2 further includes a heater unit 240, which is disposed in a body part 210 of the ejection head 200_2.

The ejection head 200_2 may further include the heater unit 240, which is disposed in the body part 210 of the ejection head 200_2. The heater unit 240 may be disposed along the inner sidewall of the body part 210. The heater unit 240 may be disposed to surround a stirring part 230. The heater unit 240 may generate heat and may thus control the temperature and the viscosity of a material contained in the body part 210. For example, the heater unit 240 may control the temperature and the viscosity of an adhesive material AM, contained in the body part 210, by supplying heat to the adhesive material AM. As the temperature of the adhesive material AM increases, the viscosity of the adhesive material AM decreases, and as the temperature of the adhesive material AM decreases, the viscosity of the adhesive material AM decreases. Thus, the viscosity of the adhesive material AM can be effectively controlled not only using a roller of the stirring part 230, but also using heat provided by the heater unit 240.

The apparatus 1_2 includes the ejection head 200_2, which includes an ejection outlet OL extending in the second direction Y and ejects the adhesive material AM while moving in the first direction X, and may apply the adhesive material AM to a uniform thickness onto a target substrate.

The apparatus 1_2 may apply the adhesive material AM to a uniform thickness onto the target substrate, using the ejection head 200_2, which includes an ejection outlet OL that is open upward, and may apply the adhesive material AM onto a second surface, in the third direction Z, of the target substrate, fixed on a second side, in the third direction Z, of a stage 100. That is, the apparatus 1_2 may apply the adhesive material AM in the opposite direction of the direction of gravity. Thus, the adhesive material AM may not move toward the stage 100. In other words, the stage 100 can be effectively prevented from being contaminated with the adhesive material AM. Also, in a case where the target substrate includes an opening OP, a side surface of the target substrate that defines the opening OP can be effectively prevented from being contaminated with the adhesive material AM.

Also, as the apparatus 1_2 can control the viscosity of the adhesive material AM, contained in the body part 210, by controlling the temperature of the adhesive material AM with the use of the heater unit 240, which is disposed in the body part 210 of the ejection head 200_2.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An apparatus for manufacturing a display device, comprising:
    a stage; and
    an ejection head including an ejection outlet, which is open in a first direction opposite to a direction of gravity,
    wherein the ejection head is configured to move in a second direction, which intersects the first direction, and disposed under the stage in the direction of the gravity,
    wherein the ejection head includes a body part, which contains an adhesive material, and a stirring part, which is disposed in the body part and includes a roller,
    wherein the roller is configured to raise the number of rotations per unit time thereof when viscosity of the adhesive material increases and configured to reduce the number of rotations per unit time thereof when the viscosity of the adhesive material decreases so as to maintain the viscosity of the adhesive material to a certain value,
    wherein the adhesive material is hydrophilic,
    wherein the ejection head further includes a heat unit disposed along an inner sidewall of the body part to surround the stirring part, the heat unit is spaced apart from the stirring part with the adhesive material therebetween,
    an inner width of an upper part of the heat unit in the second direction gradually decreases in the first direction,
    the heat unit includes an opening corresponding to the ejection outlet, and
    the adhesive material is discharged through the ejection outlet and the opening,
    wherein the heat unit is in direct contact with the adhesive material.

2. The apparatus of claim 1, wherein the ejection outlet is disposed to face the stage and extends in a third direction, which intersects the first and second directions.

3. The apparatus of claim 1, wherein the ejection head further includes an ejection driving part, which is connected to the body part and ejects the adhesive material to outside through the ejection outlet.

4. The apparatus of claim 1, further comprising:
    a light irradiation unit disposed on the opposite direction of the first direction, from the stage, the light irradiation unit applying light toward a second surface, in the opposite direction of the first direction, of the stage,
    wherein the light irradiation unit is configured to move in the second direction.

5. The apparatus of claim 4, wherein during an ejection process using the ejection head, the ejection head and the light irradiation unit move in the second direction, and the light irradiation unit is disposed in a direction opposite to the second direction from the ejection head.

6. The apparatus of claim 5, wherein during the ejection process using the ejection head, a distance between the ejection head and the light irradiation unit in the second direction is constantly maintained.

7. The apparatus of claim 4, wherein the ejection head and the light irradiation unit are integrated with each other.

8. An apparatus for manufacturing a display device, comprising:
    a stage including a mounting surface, to which a display panel is fixed, wherein the stage is rotatable; and
    an ejection head which ejects an adhesive material onto the mounting surface in a case where the stage is rotated such that the mounting surface faces in an opposite direction of a first direction, wherein the first direction is an opposite direction of gravity,
    wherein the ejection head includes a body part, which contains an adhesive material, and a stirring part, which is disposed in the body part and includes a roller,
    wherein the roller is configured to raise the number of rotations per unit time thereof when viscosity of the adhesive material increases and is configured to reduce the number of rotations per unit time thereof when the viscosity of the adhesive material decreases so as to maintain the viscosity of the adhesive material to a certain value, wherein the adhesive material is hydrophilic, wherein the ejection head further includes a heat unit disposed along an inner sidewall of the body part to surround the stirring part, the heat unit is spaced apart from the stirring part with the adhesive material therebetween, an inner width of an upper part of the heat unit in the second direction gradually decreases in the first direction, the heat unit includes a first opening corresponding to the ejection outlet, and the adhesive material is discharged through the ejection outlet and the first opening, wherein the heat unit is in direct contact with the adhesive material.

9. The apparatus of claim 8, wherein the stage includes a rotation unit, which changes an orientation direction of the mounting surface.

10. The apparatus of claim 8, wherein the ejection head is disposed to face the mounting surface when the mounting surface faces in a direction of gravity.

11. The apparatus of claim 8, wherein the ejection head includes an ejection outlet, which is open in the first direction and ejects the adhesive material.

12. The apparatus of claim 11, wherein the ejection outlet extends in a second direction, which intersects the first direction, and the ejection head ejects the adhesive material while moving in a third direction, which intersects the first and second directions.

13. The apparatus of claim 12, further comprising:

a light irradiation unit which applies light to the display panel while moving in the third direction, when the ejection head is ejecting the adhesive material, wherein the light irradiation unit is disposed in a direction opposite to the third direction from the ejection head, and the light irradiation unit temporarily cures the adhesive material disposed on the mounting surface.

14. The apparatus of claim 8, wherein the display panel defines a second opening therein, and the ejection head is disposed under the display panel and ejects the adhesive material while moving in a third direction, which intersects the first direction, but does not eject the adhesive material while passing by the second opening.

15. The apparatus of claim 14, wherein the display panel includes an application surface which faces the ejection head when the ejection head is ejecting the adhesive material, and the application surface is more hydrophilic than a side surface of the display panel that defines the second opening.

* * * * *